United States Patent [19]

Terbrack

[11] Patent Number: 4,513,255
[45] Date of Patent: Apr. 23, 1985

[54] PHASE LOCKED CRYSTAL OSCILLATOR IMPLEMENTED WITH DIGITAL LOGIC ELEMENTS

[75] Inventor: William H. Terbrack, Irvine, Calif.

[73] Assignee: Hughes Aircraft Company, Culver City, Calif.

[21] Appl. No.: 461,099

[22] Filed: Jan. 25, 1983

[51] Int. Cl.³ .......................... H03B 5/32; H03L 7/08
[52] U.S. Cl. ...................... 331/1 A; 331/27; 331/36 R; 331/158; 331/177 R; 331/179
[58] Field of Search ............ 331/1 A, 25, 27, 34, 331/36 R, 36 C, 158, 177 R, 177 V, 116 R, 116 FE, DIG. 3, 179

[56] References Cited

U.S. PATENT DOCUMENTS 3,560,879  2/1971  Fuchs .............................. 331/158 X
4,179,671 12/1979  Yoshida et al. ................. 331/179 X
4,330,759  5/1982  Anderson ......................... 331/25 X
4,376,919  3/1983  Konno et al. ................ 331/177 R X Primary Examiner—Siegfried H. Grimm
Attorney, Agent, or Firm—Joseph E. Szabo; William J. Bethurum; Anthony W. Karambelas

[57] ABSTRACT

A quartz crystal oscillator is controlled entirely by digital elements to phase lock with a reference square wavetrain by alternately switching the tuning circuit of the oscillator between first and second configurations. The ratio of the times during which the tuning circuit is in its respective configurations is a function of the relative phases of the oscillator output and the reference wavetrain and serves to determine the precise frequency of the oscillator so as to keep its output locked to the phase of the reference wavetrain.

3 Claims, 4 Drawing Figures

PHASE LOCKED CRYSTAL OSCILLATOR IMPLEMENTED WITH DIGITAL LOGIC ELEMENTS

BACKGROUND OF THE INVENTION

1. Field of the Invention

The subject invention relates generally to phase locked crystal oscillators and more particularly to an oscillator implemented with digital logic elements.

2. Description of the Prior Art

Phase locked oscillators serve many useful purposes in communication equipment. One of them is to synchronize the receiving equipment to an incoming signal so that information carried by that signal can be reliably interpreted. One example of such a signal is a square wavetrain which is encoded with a coding scheme such as the Manchester Code, in such a manner that the information carried by the wavetrain is manifested by a change in the logic level of the signal relative to the logic level of an unmodulated reference wavetrain. Thus, for example, a binary zero may be represented by the logic level of the signal wavetrain having the same value as that of the reference wavetrain and a binary one might be represented by the logic level of the signal wavetrain being opposite that of the reference wavetrain. In order to reliably interpret the information carried by such an incoming signal wavetrain it is necessary to lock a local frequency in phase with it so that a change in the logic level of the incoming signal during any given one of its cycles can be related to the logic level of the corresponding cycle of the local frequency with which it is compared.

Oscillators of the above type are well known. However, the elements generally used to lock their phase to that of a reference signal have conventionally been analog in nature, resulting in the generation of an analog error correction signal, requiring that it be filtered and conditioned before it might be used to control an analog correction device such as a tuning diode which then might in turn control the crystal oscillator phase or frequency. In applications where the local crystal oscillator is to be used with digital components, such as gate arrays, it would be a decided advantage to be able to use such components in place of the analog filtering and conditioning circuitry and the tuning diode.

It is therefore the principal object of the present invention to provide a quartz crystal oscillator whose phase can be accurately locked onto a reference wavetrain by the use of digital circuit elements.

SUMMARY OF THE INVENTION

This and other objects of the invention are achieved by providing a quartz crystal time-based oscillator circuit having a tuning circuit with first and second predetermined configurations operative to set the oscillator to first and second frequencies respectively. A digital control circuit alternately switches the tuning circuit between its two configurations in response to reversals in the relative phases of the oscillator signal and a reference voltage to which that signal is to be phase-locked.

In keeping with a preferred mode of the invention, the control circuit comprises a data flip flop and a logic gate, with the flip flop having its data input and its clock input connected to receive the oscillator output signal and the reference voltage and an output connected to one of the inputs of the logic gate. The state of the flip flop is a function of the relative phases of the oscillator output frequency and of the reference voltage. Accordingly, a logic signal is applied to the logic gate indicative of the relative phases of the oscillator signal and the reference voltage. In turn the logic gate serves to operatively connect the tuning circuit in alternate ones of its two configurations depending upon whether one or the other of the oscillator signal and reference signal is leading. By deliberately selecting the oscillator frequency to be higher (or lower) than that of the reference signal the frequency of the former can be changed in the proper direction to bring it back in phase with the latter. Further features of the invention will become apparent from the following detailed description with reference to the attached drawings.

DETAILED DESCRIPTION OF THE PREFERRED EMBODIMENT

Figure 1:
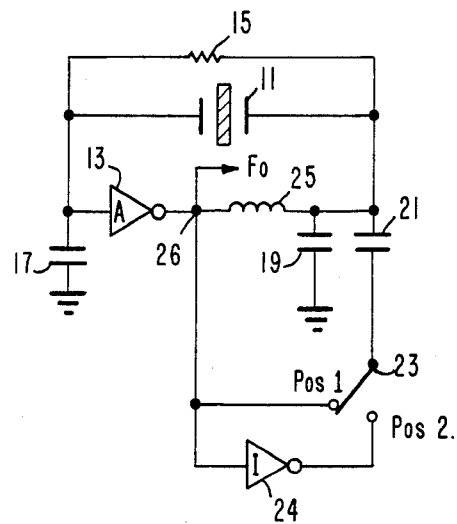
FIG. 1 illustrates a quartz crystal oscillator having a manually operable switch for placing the oscillator's tuning circuit in alternate ones of its two configurations.

FIG. 1 illustrates a quartz crystal time-based oscillator circuit 10 of the type to which the present invention may be applied. Its principal components are a quartz crystal 11 having one of its terminals connected to the input of an amplifier 13 and having its other terminal connected to the output of that amplifier. The amplifier may be a simple CMOS inverter such as that made by National Semiconductor under its part number MM54HCO4. The latter component includes six identical inverters, one of which would serve the purpose of the amplifier 13 in FIG. 1. Connected respectively between the input and output of the amplifier 13 and ground are capacitors 17 and 19 which serve to determine the operating frequency of the oscillator. Also part of the tuning circuit are an inductor 25 and a fine tuning capacitor 21 connected in series between the output of the amplifier 13 and one terminal of a switch 23. The other terminal of the switch 23 is connected through an inverter 24 to the point 26 where the output of amplifier 13 joins the inductor 25.

Typical component values for the exemplary circuit of FIG. 1 are:

| Component | Value |
| --- | --- |
| Capacitor 17 | 27 pF |
| Capacitor 19 | 27 pF |
| Capacitor 21 | 10 pF |
| Quartz Crystal 11 | 5 MHz |
| Resistor 15 | 200K |
| Inductor 25 | 20 µHy |

The nominal frequency of the oscillator circuit is determined by its quartz crystal 11 and will in the present case be approximately 5 megahertz. Its actual operating frequency will, however, depend on the position of the switch 23. When the switch is in position 1, capacitor 21 is in parallel with the inductor 25, so that a minimum (0) potential is applied across the series combination of components 21 and 23. In position 2 the switch 23 connects the free end of capacitor 21 to the output of the inverter 24, causing the maximum voltage (twice that at the output of amplifier 13) to be applied across the series combination of inductor 25 and capacitor 21. The first of the resulting circuit configurations causes an increase in the oscillator's operating frequency. The second configuration results in a drop in frequency, a frequency 900 hertz change having been measured in the illustrated circuit.

The present invention is based on the observation that the average frequency of the oscillator 12 can be set to any desired value within the range of values attainable with the two circuit configurations, and that this can be done by alternating the switch 23 between its two positions and controlling the proportion of the times during which the switch 23 is in its respective positions. Basically, the greater the proportion of time during which the capacitor 21 is connected to the output of inverter 24, the greater will be the drop in the average frequency of the oscillator from its nominal level.

Figure 2:
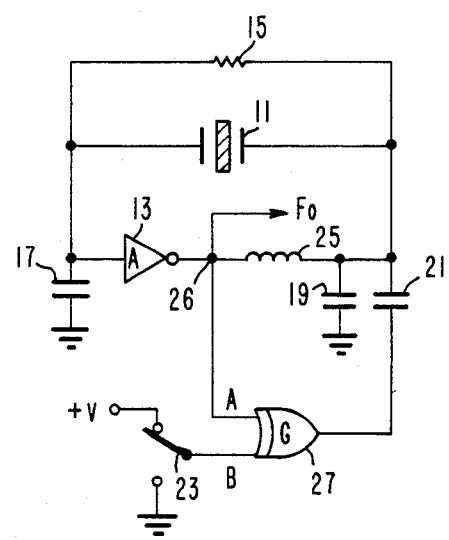
FIG. 2 illustrates the circuit of FIG. 1 with an EXCLUSIVE OR gate replacing the switch of FIG. 1, with one of the inputs of the gate being controlled by a manually operable switch.

The first step in implementing digital control of the oscillator's average frequency is attained by the addition of an EXCLUSIVE OR gate 27, resulting in the oscillator circuit 14 of FIG. 2. A suitable component for this function is National Semiconductor model MM54HC86, which contains four such exclusive OR gates. One input of the gate is connected to node 26, the other input to the switch 23 which in alternate ones of its two positions, applies to that input a logic 0 and a logic 1 voltage level respectively. A well known characteristic of the EXCLUSIVE OR gate is that, when one of its inputs is at a logic 1 level its output will be at the logic level which is the inverse of the logic level at its other input. Conversely, when the logic level at the first input is at a zero level, the logic level of the OR gate output will be the same as (or in phase with) the logic level at the other input. Consequently, the output C of gate 27 can be selected to be in phase with, or in phase opposition to, the input A of the gate by applying a logic zero or a logic 1 level respectively to its B input. The effect of bringing the output voltage level at the output C of the gate 27 in phase with its input A is to bring about the first circuit configuration in which the bottom plate of the capacitor 21 is kept at the same potential as the node 26 between the amplifier 13 and the inductor 25. Conversely, the effect of maintaining the output C of the gate 27 in phase-opposition to the voltage applied at its input A is to bring about the second circuit configuration in which a substantial voltage is applied across inductor-capacitor combination 25-21.

To avoid overcorrection and at the same time limit the frequency excursion range of the oscillator, a resistor 28 may be added in series with capacitor 21. The resistor reduces the Q of the inductor-capacitor circuit 25-21 and results in more gradual frequency transitions at the time the oscillator frequency is switched. In the basic circuit shown in FIG. 3 and with resistor 28=1 K the frequency excursion range was measured to be about 800 Hz.

Figure 3:
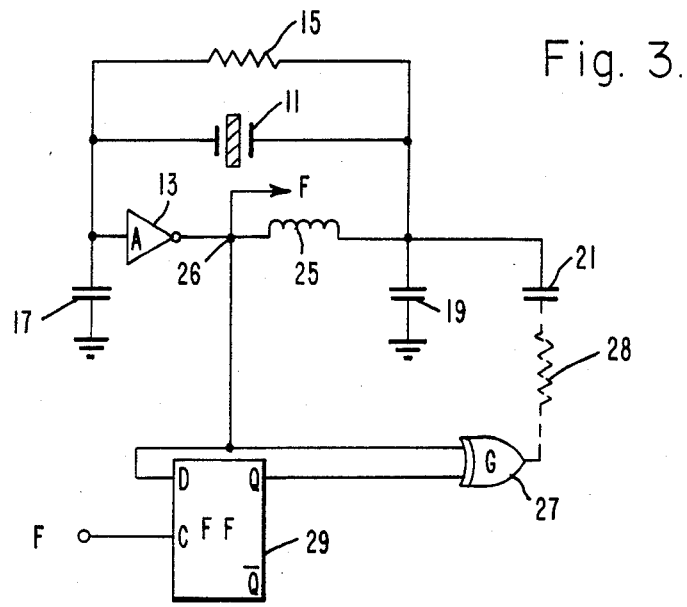
FIG. 3 illustrates the circuit of FIG. 2, with the manually operable switch replaced by a data flip flop.

FIG. 3 illustrates the oscillator of the present invention with its digital tuning circuit fully implemented. This is accomplished by replacing the switch 23 with a data flip flop 29. Such flip flops are well known to those skilled in the art. Reference may be made to page 166 of Digital Networks and Computer Systems by Taylor L. Booth published by John Wiley and Sons, Inc., 1971. A specific discrete component suitable for the purpose, and containing two data flip flops is National Semiconductors model MM54HC74. Such flip flops are characterized by a clock input and a data input and by a pair of outputs labeled Q and $\overline{Q}$ which are at mutually inverse logic levels. When a square wavetrain is applied to the C input of the flip flop, the flip flop is placed in the same logic state as then exists at its D input. Regardless of any variations at that input, the Q output level (as well as the $\overline{Q}$ output level) remains the same until the next positive-going edge in the waveform applied at the C input. At that time the logic state of the flip flop is reset so that the logic level existing at its Q output will again correspond to that then existing at its D input.

To carry out the objectives of the present invention the D input of the flip flop 29 receives the signal $F_o$ appearing at the output of the amplifier 13, which is also applied to the A input of the EXCLUSIVE OR gate 27. The B input of that OR gate is connected to receive the output appearing at the Q terminal of the flip flop 29, whose clock input in turn is connected to receive the reference waveform $F_i$.

Figure 4:
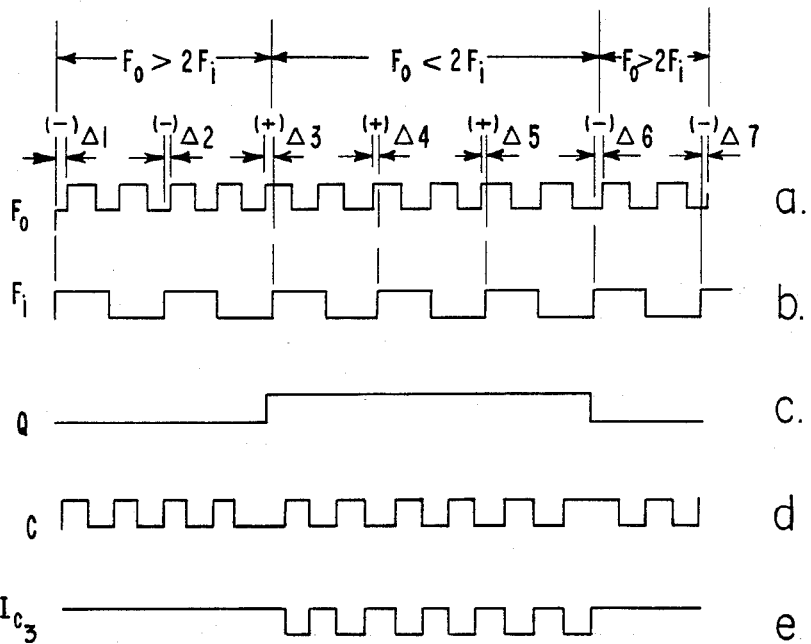
FIG. 4 illustrates a series of waveforms which exist in the circuit of FIG. 3.

Operation of the circuit will become apparent by referring to FIG. 4. The output of the oscillator 13 is shown in FIG. 4a. It is shown as a square wave, it being understood, however, that the circuit would also operate satisfactorily if a sinusoidal wave were generated. Shown below the oscillator output waveform $F_o$ is the reference waveform $F_i$ in FIG. 4b. It will be seen that, during the first two cycles of the incoming reference waveform $F_i$, the oscillator output waveform, $F_o$, whose frequency is twice that of the reference waveform, lags the reference waveform in phase. This is shown by the notations $\Delta 1$, $\Delta 2$ and $\Delta 3$ appearing at the leading edge of the incoming reference waveform $F_i$, with the further notations (−) appearing immediately above the designations $\Delta 1$ and $\Delta 2$. It is also seen by comparing the FIGS. 4a and 4b that, just prior to the third leading edge (positive going) of the waveform $F_i$, the oscillator output waveform $F_o$ has advanced into a phase leading relationship, indicated by the sign (+) above the symbol $\Delta 3$ showing the relative phases of the two waveforms $F_o$ and $F_i$, resulting in a reversal in the state of the flip flop 29 and consequently of the logic level existing at its Q output, as shown in FIG. 4c. It is seen that, coincidentally with the first leading edge of the waveform $F_i$ during which the reversal in relative phases occurs, the logic level of Q rises from 0 to 1.

During the initial period shown in FIG. 4, during which the flip flop 29 maintains its Q output at a logic 0 level, that level is applied to the B input of the EXCLUSIVE OR gate 27. Consequently, as explained above, the logic level at the C output of the EXCLUSIVE OR gate 27 will be the same as that at its A input. In other words, the two will be in phase. This is readily apparent by comparing the waveforms of FIGS. 4a and 4d during the initial illustrated period, when $F_o$ is greater than twice $F_i$. Accordingly, since this effectively connects the fine tuning capacitor C3 across the inductor 25, the voltage applied across the series combination of those two components is zero, causing a minimum current to flow through the capacitor 21 and causing the oscillator operating frequency to be at its highest within its adjustable range.

As a result of the oscillator output frequency $F_o$ being slightly higher than the frequency of the incoming reference waveform $F_i$, the phase lag of $F_o$ relative to $F_i$ progressively diminishes to the point just noted, where the phase of $F_o$ overtakes that of $F_i$ and assumes a leading relationship thereto. When, at that point, the logic state of the flip flop 29 reverses, the configuration of the tuning circuit, which includes the inductor 25 and the capacitor 21, changes so that the voltage applied to the bottom plate (as seen in FIG. 3) of the capacitor 21 relative to the voltage level at the junction point 26 of the amplifier 13 and the inductor 25 is 180° out of phase, which can again be seen by comparison of the waveforms in FIGS. 4a and 4d. This results in the maximum voltage being applied across the series combination of the inductor 25 and the capacitor 21, causing the maximum current to be drawn through the capacitor 21 and causing an increased drop in the frequency of the oscillator. This is reflected by a progressive reduction in the phase lead of the oscillator output frequency $F_o$ relative to the reference waveform $F_i$, a process which continues until the oscillator output $F_i$ again drops in phase behind the reference waveform $F_i$. At that point, illustrated by the first of the second pair of (—) symbols above FIG. 4a, the flip flop logic state reverses again, returning its Q output to the logic zero level. This causes the oscillator frequency to return to its initial, higher, level. Thereupon the process with which the FIG. 4 illustration began is repeated and, due to its increased frequency, the oscillator output waveform $F_o$ progressively catches up in phase to the reference waveform $F_i$, until the flip flop 29 is again reversed in phase. In this manner the oscillator output frequency is caused to hunt between the two levels associated with the two possible configurations of its tuning circuit, each configuration being initiated in response to a reversal in the phase relationship of the waveforms $F_o$ and $F_i$.

While the exemplary circuit of FIG. 3 shows the use of discrete logic blocks for sake of illustration, it should be understood that the preferred way to implement the circuit is by means of a configurable gate array, such as that available from California Devices Inc. of San Jose, Ca, as model HC5400.

What is claim is:

1. A quartz crystal time-based oscillator circuit adapted to phase-lock onto a square wave reference frequency to produce an oscillator signal, said oscillator circuit including a quartz crystal having a single natural resonant frequency and a tuning circuit having reactive elements interconnectable into first and second predetermined electrical circuit configurations operative to set said oscillator to operate at first and second predetermined frequencies respectively, said oscillator circuit being characterized by digital control means for alternately switching said tuning circuit into its first and second configurations in response to reversals in the relative phases of said reference frequency and said oscillator signal, said control means includes a flip flop and a logic gate, said logic gate having its output connected to said tuning circuit, one of its inputs connected to respond to the oscillator signal and another of its inputs connected to respond to an output of said flip flop, said flip flop having a data input and a clock input, one connected to respond to said oscillator signal and the other connected to respond to said reference frequency.

2. The oscillator of claim 1 wherein said logic gate is an EXCLUSIVE OR gate and wherein said flip flop is a data flip flop.

3. A quartz crystal time-based oscillator circuit adapted to phase-lock onto a square wave reference frequency to produce an oscillator signal, said oscillator circuit including a quartz crystal, an amplifier, and a tuning circuit including an inductor connected in series with said amplifier and said quartz crystal to form a series loop, said tuning circuit also including a fine tuning capacitor having one plate connected to the junction of said inductor and said quartz crystal, said tuning circuit having first and second predetermined configuration operative to set said oscillator to operate at first and second frequencies respectively, said oscillator circuit being characterized by digital control means for alternately switching said tuning circuit into first and second configurations in response to reversals in the relative phases of said reference frequency and said oscillator signal, said control means including a data flip-flop and an EXCLUSIVE OR gate, said gate having its output connected to said tuning circuit, one of its inputs connected to respond to the oscillator signal, and another of its inputs connected to respond to an output of said flip-flop, said flip-flop having a data input and a clock input, one connected to respond to said oscillator signal and the other connected to respond to said reference frequency said EXCLUSIVE OR gate being operative to alternately connect the other plate of said fine tuning capacitor to two points in said circuit so as to alternate the voltage applied across the series combination of said inductor and said capacitor between predetermined minimum and maximum values.

* * * * *